United States Patent
Ke et al.

(10) Patent No.: US 6,864,564 B2
(45) Date of Patent: Mar. 8, 2005

(54) FLASH-PREVENTING SEMICONDUCTOR PACKAGE

(75) Inventors: Chun-Chi Ke, Taichung (TW); Randy H. Y. Lo, Taipei (TW); ChiChuan Wu, Taichung (TW)

(73) Assignee: Siliconware Precision Industries, Co., Ltd. (TW)

( * ) Notice: Subject to any disclaimer, the term of this patent is extended or adjusted under 35 U.S.C. 154(b) by 0 days.

(21) Appl. No.: 10/039,219

(22) Filed: Jan. 2, 2002

(65) Prior Publication Data

US 2002/0163066 A1 Nov. 7, 2002

(30) Foreign Application Priority Data

May 2, 2001 (TW) ........................................ 90110468 A

(51) Int. Cl.⁷ ........................ H01L 23/495; H01L 23/12
(52) U.S. Cl. ....................... 257/666; 257/692; 257/693; 257/704
(58) Field of Search ................................. 257/666, 667, 257/669, 672, 674, 676, 680, 690, 692, 693, 787, 678, 704, 788, 668, 675, 789, 790–796, 730, 731, 701–707

(56) References Cited

U.S. PATENT DOCUMENTS

| | | | |
|---|---|---|---|
| 5,070,041 A | 12/1991 | Katayama et al. | 437/214 |
| 5,479,051 A | * 12/1995 | Waki et al. | 257/724 |
| 5,523,608 A | * 6/1996 | Kitaoka et al. | 257/433 |
| 6,315,465 B1 | * 11/2001 | Mizue et al. | 385/94 |

* cited by examiner

Primary Examiner—Long Pham
Assistant Examiner—DiLinh Nguyen
(74) Attorney, Agent, or Firm—Peter F. Corless; Steven M. Jensen; Edwards & Angell, LLP

(57) ABSTRACT

A semiconductor package and a method for fabricating the same are proposed, in which a lead frame is modified to form protrusions at sides of middle portions of leads to reduce spacing between the adjacent middle portions. This allows resin flow to slow down in speed during molding and reduces area available for resin flashes occurring thereon, so as to effectively eliminate the occurrence of resin flashes on the leads. Moreover, tapes can be adhered onto the lead frame for covering spacing between adjacent leads of the lead frame; this further helps prevent resin flashes from occurrence. In such an environment free of resin flashes, die-bonding and wire-bonding processes can be proceeded smoothly with assurance of quality and reliability of fabricated semiconductor packages.

3 Claims, 2 Drawing Sheets

FLASH-PREVENTING SEMICONDUCTOR PACKAGE

FIELD OF THE INVENTION

The present invention relates to semiconductor packages and methods for fabricating the same, and more particularly, to a semiconductor package with a modified lead frame and a method for fabricating the semiconductor package.

BACKGROUND OF THE INVENTION

A conventional semiconductor package used as an image sensor device typically includes a lead frame having a die pad and a plurality of leads, and an encapsulant formed with the lead frame. The encapsulant is formed with a cavity for receiving a semiconductor chip mounted on the die pad that is exposed to the cavity. In addition, a lid is adhered to the encapsulant in such a manner that the cavity is sealed thereby, allowing the semiconductor chip to be separated from the ambient. During the formation of the encapsulant, a molding resin for forming the encapsulant usually flashes on the portion of the lead frame exposed to the cavity, which thus contaminates surfaces of the die pad and leads that are exposed to the cavity, so that the die bonding between the die pad and the semiconductor chip, and wire bonding between the semiconductor chip and the leads, are adversely affected.

Accordingly, U.S. Pat. No. 5,070,041 discloses a method of removing flashes from a semiconductor lead frame, in which prior to forming an encapsulant on the lead frame by a molding resin, the lead frame is coated with an organic high molecular substance on its portions expected to be in non-contact with the molding resin. Such an organic high molecular substance has a melting or softening point higher than the molding temperature of the molding resin for forming the encapsulant, and is soluble in a solvent which does not dissolve the encapsulant. Thereby after a molding process is completed with the formation of the encapsulant, the coated lead frame bearing the encapsulant is immersed in the solvent for dissolving away the coated organic high molecular substance. As a result, undesired flashes of the molding resin occurring on the lead frame can be removed in facility with the dissolution of the organic high molecular substance, so as to assure good electrical connection between the lead frame and a semiconductor chip mounted on the lead frame.

However, the foregoing flash-removing method in the use of the organic high molecular substance is rather complex in proceeding with a procedure of coating the lead frame with the organic high molecular substance, and an additional post-treatment of using the solvent for dissolving away the coated organic high molecular substance, thereby making fabrication processes undesirably increased in cost and time consumption but decreased in productivity and efficiency. Therefore, how to develop a more simplified method for fabricating a semiconductor package in prevention of resin flashes is highly desired, which can be more cost-effectively implemented, and effectively help eliminate the occurrence of resin flashes as well as improve package productivity.

SUMMARY OF THE INVENTION

A primary objective of the present invention is to provide a semiconductor package and a method for fabricating the same, in which a lead frame is structurally modified, so as to prevent a molding resin from flashing on leads of the lead frame.

Another objective of the invention is to provide a semiconductor package and a method for fabricating the same, in which quality of die bonding and wire bonding can be assured in compliance with reliability of the semiconductor package.

A further objective of the invention is to provide a semiconductor package and a method for fabricating the same, in which the semiconductor package can be more simply and cost-effectively fabricated.

In accordance with the foregoing and other objectives, the present invention proposes a semiconductor package with a modified lead frame, comprising: a lead frame having a first side and a second side, and formed with a die pad and a plurality of leads surrounding the die pad, wherein the leads are each defined into an inner lead, an outer lead and a middle portion positioned between the inner lead and the outer lead, and each of the middle portions extends outwardly at sides thereof to form protrusions; an encapsulant for encapsulating the lead frame with the outer leads being exposed, wherein a cavity is formed in the encapsulant for exposing the die pad and the inner leads on the first side of the lead frame, allowing a semiconductor chip and bonding wires to be received in the cavity; a semiconductor chip mounted in the cavity on the die pad of the first side of the lead frame; a plurality of bonding wires formed in the cavity for electrically connecting the semiconductor chip to the inner leads of the lead frame; and a lid adhered onto the encapsulant for covering an opening of the cavity.

A method for fabricating the semiconductor package of the invention comprises the steps of: providing a lead frame having a first side and a second side, wherein the lead frame is formed with a die pad and a plurality of leads surrounding the die pad, and the leads are each defined into an inner lead, an outer lead and a middle portion positioned between the inner lead and the outer lead, with each of the middle portions extending outwardly at sides thereof to form protrusions; forming an encapsulant to encapsulate the lead frame with the outer leads being exposed, wherein a cavity is formed in the encapsulant for exposing the die pad and the inner leads on the first side of the lead frame, allowing a semiconductor chip and bonding wires to be received in the cavity; mounting a semiconductor chip in the cavity on the die pad of the first side of the lead frame; forming a plurality of bonding wires in the cavity to electrically connect the semiconductor chip to the inner leads of the lead frame; and adhering a lid onto the encapsulant to cover an opening of the cavity.

The middle portions of the leads are arranged in a manner that spacing between adjacent middle portions is equal to or smaller than 0.15 mm, preferably 0.10 mm. Moreover, prior to the step of forming the encapsulant, a first tape can be adhered to the second side of the lead frame; or further, besides the first tape, a second tape can be adhered to part of the first side of the lead frame, so as to cover the middle portions of the leads and part of the inner leads in a manner as not to interfere with the bonding wires. The first and second tapes are used to further prevent resin flashes from occurring on the leads. Therefore, in application of the modified lead frame and the tapes, quality of fabricated semiconductor packages can be assured.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1A:
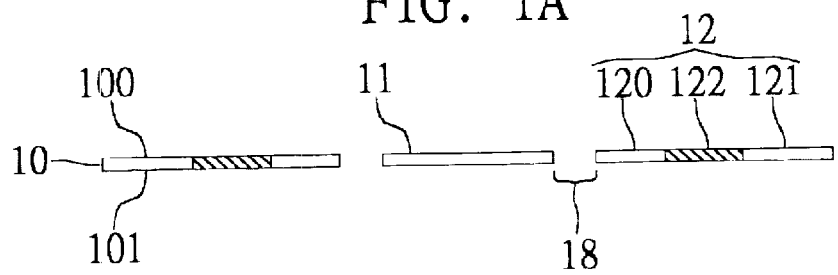
FIGS. 1A–1D are schematic cross-sectional diagrams a method for fabricating a semiconductor package of a first preferred embodiment of the invention.
Figure 1B:
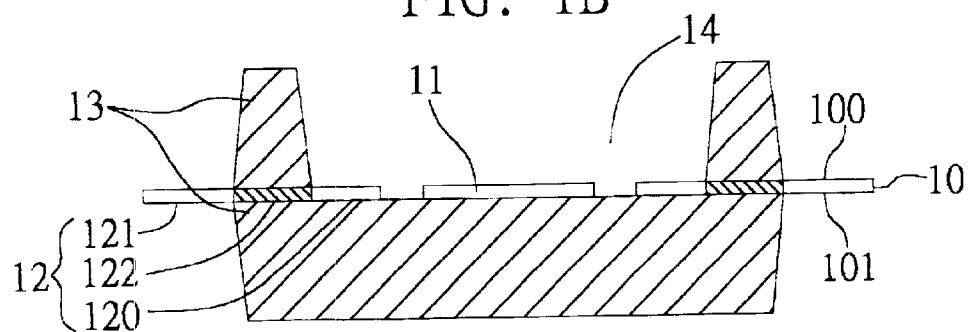
Figure 1C:
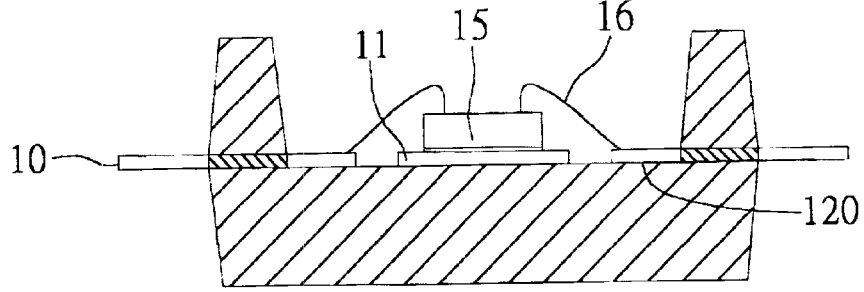
Figure 1D:
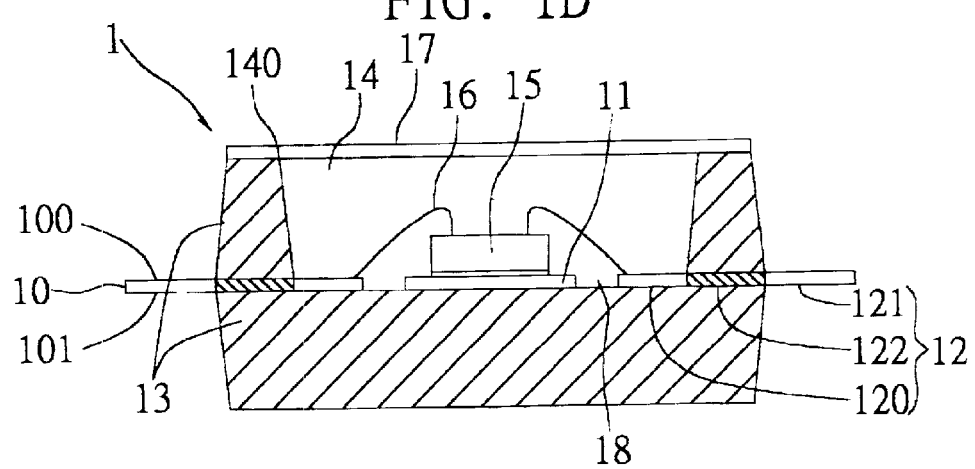
Figure 2:
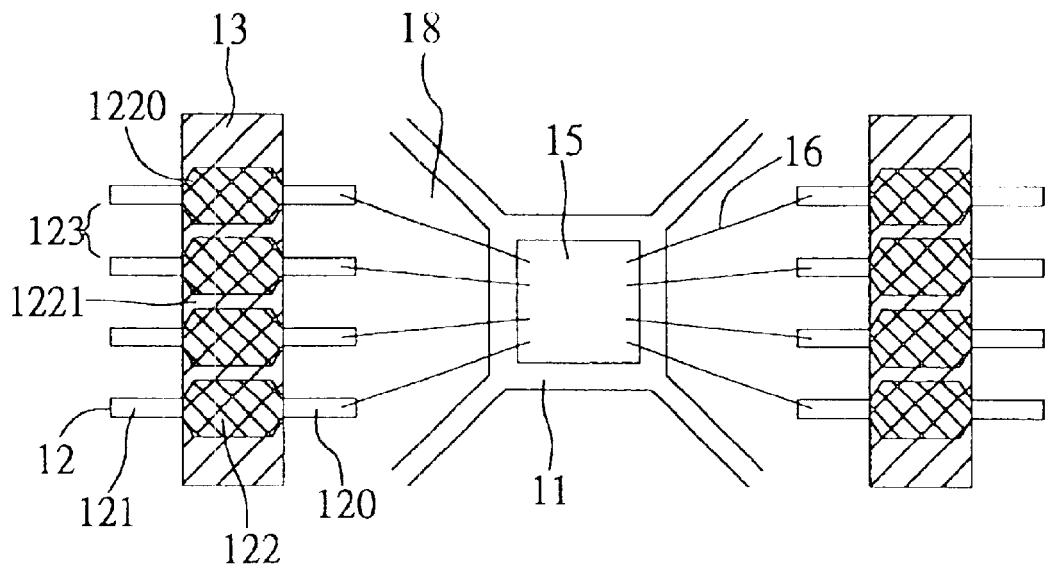
FIG. 2 is a top view of FIG. 1C.

Referring to FIGS. 1D and 2, a semiconductor package 1 of a first preferred embodiment of the invention comprises: a lead frame 10 having a first side 100 and a second side 101, which includes a die pad 11 and a plurality of leads 12 surrounding the die pad 11, wherein the leads 12 are each defined into an inner lead 120, an outer lead 121 and a middle portion 122 positioned between the inner lead 120 and the outer lead 121, and each middle portion 122 extends outwardly at two sides thereof to form protrusions 1220; an encapsulant 13 formed for encapsulating the lead frame 10 in a manner that, the outer leads 121 are exposed to outside of the encapsulant 13, and a cavity 14 is formed in the encapsulant 13 for exposing the die pad 11 and the inner leads 120 on the first side 100 of the lead frame 10, allowing a semiconductor chip and bonding wires to be received in the cavity 14; a semiconductor chip 15 mounted in the cavity 14 on the die pad 11 of the lead frame 10; a plurality of bonding wires 16 formed in the cavity 14 for electrically connecting the semiconductor chip 15 to the inner leads 120 of the lead frame 10; and a lid 17 adhered onto the encapsulant 13 for covering an opening 140 of the cavity 14.

FIGS. 1A–1D illustrate a method for fabricating the semiconductor package of the first embodiment of the invention.

Referring to first FIG. 1A, a lead frame 10 having a first side 100 and a second side 101 is provided, which includes a die pad 11 and a plurality of leads 12 surrounding and properly spaced from the die pad 11 by a gap 18 (as shown in FIG. 2). The leads 12 are each defined into an inner lead 120, an outer lead 121 and a middle portion 122 positioned between the inner lead 120 and the outer lead 121; the leads 12 are arranged in parallel with spacing 123 formed between two adjacent leads 12. Additionally, each middle portion 122 extends outwardly at two sides thereof to form protrusions 1220, thereby making spacing 1221 between two adjacent middle portions 122 reduced to be smaller than the spacing 123 between the adjacent leads 12, wherein the spacing 1221 is equal to or smaller than 0.15 mm, preferably 0.10 mm. It should be noted that, the protrusions 1220 of the middle portions 122 are not limited to the trapezoid shape illustrated in FIG. 2, whereas other achievable structures or shapes of the protrusions 1220 are also pertained to the scope of the invention.

Referring next to FIG. 1B, a molding process is performed to form an encapsulant 13 by using a conventional resin compound e.g. epoxy resin for encapsulating the lead frame 10 in a manner that, the outer leads 121 are exposed to outside of the encapsulant 13, and a cavity 14 is formed in the encapsulant 13 for exposing the die pad 11 and the inner leads 120 on the first side 100 of the lead frame 10, allowing a semiconductor chip and bonding wires to be received in the cavity 14.

Referring further to FIG. 1C, die-bonding and wire-bonding processes are performed for mounting a semiconductor chip 15 in the cavity 14 on the die pad 11 of the lead frame 10, and forming a plurality of bonding wires 16 e.g. gold wires in the cavity 14 to electrically connect the semiconductor chip 15 to the inner leads 120 of the lead frame 10. Since the die-bonding and wire-bonding processes are well known in the art, they are not further detailed herein.

Referring finally to FIG. 1D, a lid 17 made of a transparent or nontransparent material dimensionally larger than an opening 140 of the cavity 14 is adhered onto the encapsulant 13 so as to cover the opening 140, and therefore the semiconductor package 1 is completely fabricated.

In conclusion, as compared to the complex flash-preventing method disclosed in the prior art, the semiconductor package of the invention simply adopts a structurally modified lead frame with outwardly extending protrusions formed at middle portions of leads of the lead frame, so as to reduce spacing between adjacent middle portions of the leads. The narrowed arrangement of the leads allows resin flow to slow down in speed during molding, and reduces area available for a resin compound of forming an encapsulant to flash thereon, so that resin flashes can be prevented from occurrence on the leads. In such an environment free of resin flashes, die-bonding and wire-bonding processes can be proceeded smoothly with assurance of quality and reliability of the fabricated semiconductor package. Moreover, since the semiconductor package of the invention is fabricated by using a simplified method with the only structural modification of the lead frame, so that the fabrication processes are cost-effectively implemented without increasing the complexity thereof.

Second Preferred Embodiment

Figure 3:
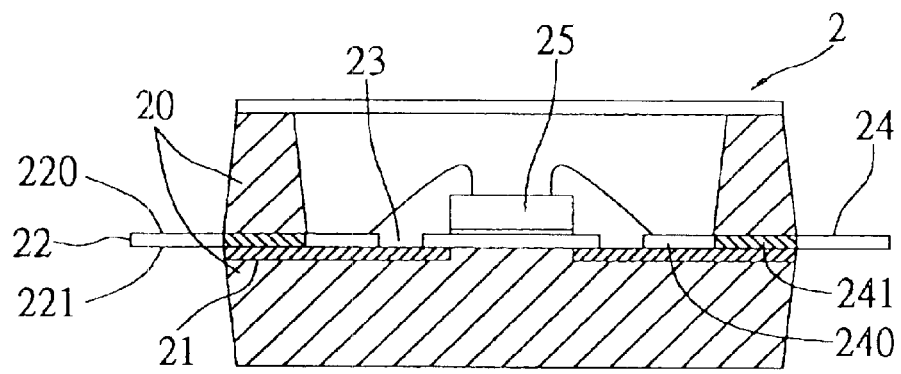
FIG. 3 is a cross-sectional view of a semiconductor package of a second preferred embodiment of the invention.

FIG. 3 illustrates a sectional view of a semiconductor package 2 of a second preferred embodiment of the invention. The semiconductor package 2 is similarly fabricated by the method disclosed in the first embodiment, with the only difference in that prior to the step of forming an encapsulant 20, a first tape 21 e.g. an insulative tape is adhered to part of a second side 221 of a lead frame 22, so as to cover a gap 23 defined between leads 24 and a semiconductor chip 25, and spacing (not shown) between adjacent inner leads 240 and between adjacent middle portions 241 of the leads 24. This helps prevent a molding resin from flashing through the gap 23 and the spacing from the second side 221 onto a first side 220 of the lead frame 22. Therefore, since the tape adhering process does not increase the complexity in manufacture, and the tape 21 in cooperation with the lead frame 22 can further enhance the prevention of the resin flash, so that the semiconductor package 2 is assured in quality and cost-effective to fabricate.

Third Preferred Embodiment

Figure 4:
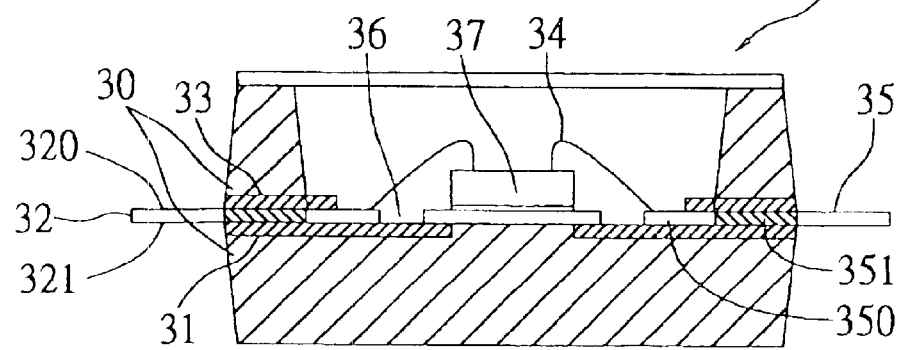
FIG. 4 is a cross-sectional view of a semiconductor package of a third preferred embodiment of the invention.

FIG. 4 illustrates a sectional view of a semiconductor package 3 of a third preferred embodiment of the invention. The semiconductor package 3 is similarly fabricated by the method disclosed in the second embodiment, with the only difference in that prior to the molding step, besides a first tape 31 adhered to a second side 321 of a lead frame 32, a second tape 33 is adhered to part of a first side 320 of the lead frame 32, and used to cover spacing (not shown) between adjacent inner leads 350 and between middle portions 351 of leads 35 in a manner as not to interfere with the arrangement of the bonding wires 34. As a result, the tapes 31, 33 for covering the spacing and a gap 36 defined between the leads 35 and a semiconductor chip 37, and the lead frame 32 with protruded middle portions 351 of the leads 35, further help eliminate the occurrence of the resin flash; this therefore improves the quality and reliability of the semiconductor package 3.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:

a lead frame having a first side and a second side, and formed with a die pad and a plurality of leads surrounding the die pad, wherein the leads are each defined into an inner lead, an outer lead and a middle portion positioned between the inner lead and the outer lead, and each of the middle portions extends outwardly at sides thereof to form protrusions for reducing spacing between the adjacent middle portions of the leads, wherein the middle portions of the leads are arranged in a manner that spacing between adjacent middle portions is 0.10 mm, or equal to or smaller than 0.15 mm;

an encapsulant for encapsulating the middle portions of the leads and the second side of the lead frame with the outer leads being exposed, wherein a cavity is formed in the encapsulant for exposing the die pad and the inner leads on the first side of the lead frame, allowing a semiconductor chip and bonding wires to be received in the cavity;

the semiconductor chip mounted in the cavity on the die pad of the first side of the lead frame;

the plurality of bonding wires formed in the cavity for electrically connecting the semiconductor chip to the inner leads of the lead frame; and a lid adhered onto the encapsulant for covering an opening of the cavity.

2. The semiconductor package of claim 1, further comprising a first tape adhered to the second side of the lead frame.

3. The semiconductor package of claim 2, further comprising a second tape adhered to the first side of the lead frame in a manner free of interference with arrangement of the bonding wires.

* * * * *